(12) United States Patent
Kirsch et al.

(10) Patent No.: US 6,754,131 B2
(45) Date of Patent: Jun. 22, 2004

(54) WORD LINE DRIVER FOR NEGATIVE VOLTAGE

(75) Inventors: Howard Kirsch, Eagle, ID (US); Tae Hyoung Kim, Boise, ID (US); Charles L. Ingalls, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/231,389

(22) Filed: Aug. 29, 2002

(65) Prior Publication Data

US 2004/0042321 A1 Mar. 4, 2004

(51) Int. Cl.[7] .............................................. G11C 8/00
(52) U.S. Cl. ................................. 365/230.06; 365/229
(58) Field of Search ............................ 365/230.06, 229

(56) References Cited

U.S. PATENT DOCUMENTS

| | | | |
|---|---|---|---|
| 5,257,238 A | 10/1993 | Lee et al. .............. | 365/230.06 |
| 5,627,487 A | 5/1997 | Keeth .......................... | 327/112 |
| 5,898,637 A | 4/1999 | Lakhani et al. ........ | 365/230.06 |
| 5,959,884 A | 9/1999 | Chevallier et al. ...... | 365/185.05 |
| 6,307,805 B1 * | 10/2001 | Andersen et al. ....... | 365/230.06 |
| 6,324,088 B1 | 11/2001 | Keeth et al. .................. | 356/51 |
| 6,614,711 B2 | 9/2003 | Schreck ................. | 365/230.06 |

* cited by examiner

*Primary Examiner*—M. Tran
(74) *Attorney, Agent, or Firm*—Schwegman, Lundberg, Woessner & Kluth, P.A.

(57) ABSTRACT

A word line driver includes multiple current paths for driving a word line of a memory device to a negative voltage and a positive voltage. When driving the word line from the negative voltage to the positive voltage, the word line driver uses a first current path to drive the word line to the positive voltage in one stage. When driving the word line from the positive voltage to the negative voltage, the word line driver drives the word line from the positive voltage to ground using the first current path in a first stage. In a second stage, the word driver further drives the word line from ground to the negative voltage in using a second current path.

27 Claims, 12 Drawing Sheets

WORD LINE DRIVER FOR NEGATIVE VOLTAGE

FIELD

The present invention relates generally to semiconductor devices, and in particular to drivers for word lines in memory devices.

BACKGROUND

Memory devices often reside in computers and electronic products to store data. A memory device has many memory cells, each holding an electrical charge that represents a bit of data. External data is stored in the memory cells during a write operation. The stored data is retrieved from the memory cells during a read operation. The write and read operations are memory access operations.

A typical memory device has a number of control lines, each connecting to one or more corresponding memory cells. During a memory access operation, the memory device controls a voltage on each control line to access the memory cells to either store data or retrieve data. Control lines of these types are usually called word lines.

A typical memory device has a number of word line drivers. Each word line driver drives a corresponding word line to various voltages. For example, some memory devices have word line drivers that drive the corresponding word lines to a positive voltage during a memory access operation. After the memory access operation, the word line drivers drive the corresponding word lines to a negative voltage.

Some memory devices have word line drivers that drive the corresponding word lines from a positive voltage to a negative voltage using one discharge path. In some of these memory devices, driving the word lines from a positive voltage to a negative voltage using one discharge path generates excessive noise, causing the memory device to perform inefficiently.

SUMMARY OF THE INVENTION

The present invention provides circuits and methods for driving word lines of memory devices to a negative voltage without generating excessive noise.

In one aspect, a memory device includes a memory cell connected to a word line. A word line driver drives the word line to various voltages. The word line driver has multiple paths: a first path and a second path, each connecting to the word line. The first path serves as both a charging path and a discharging path. The second path serves as another discharging path. During a first state of a control signal, the first path charges the word line to a positive voltage. During a second state of the control signal, the first path discharges the word line to ground. The second path further discharges the word line from ground to a negative voltage during the second state of the control signal.

Another aspect offers a method that includes driving a word line connected to a memory cell to a first voltage via a first path to access the memory cell. After the memory is accessed, the method drives the word line to a second voltage via the first path. The method further drives the word line from the second voltage to a third voltage via a second path. The first voltage, the second voltage, and the third voltage are unequal.

DESCRIPTION OF EMBODIMENTS

Figure 1:
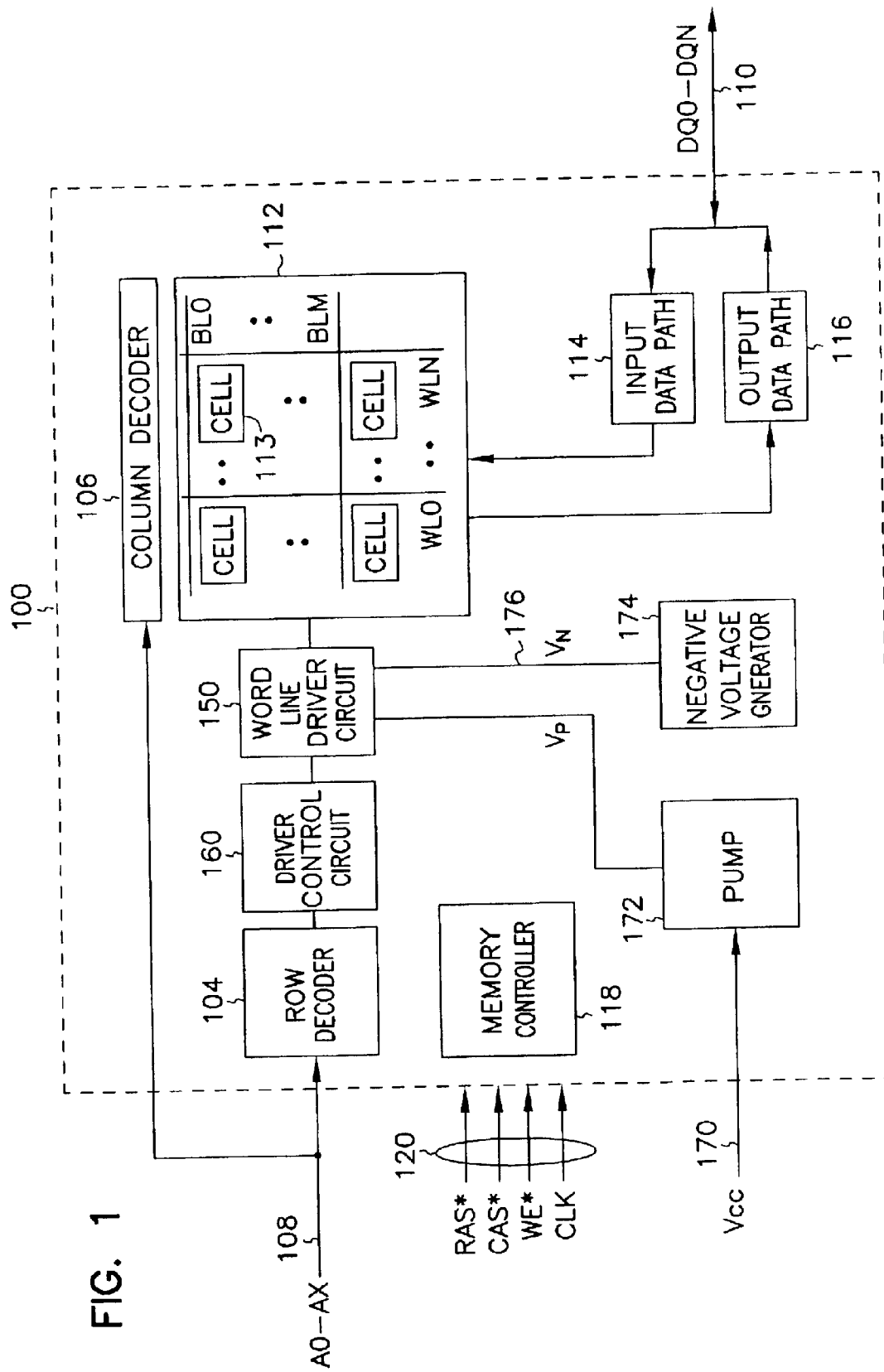
FIG. 1 shows a memory device having a word line driver circuit according to an embodiment of the invention.

The following description and the drawings illustrate specific embodiments of the invention sufficiently to enable those skilled in the art to practice it. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows a memory device having a word line driver circuit according to an embodiment of the invention. Memory device 100 includes a main memory 112 having a plurality of memory cells 113 arranged in rows and columns along with word lines (WL0–WLN) and bit lines (BL0–BLM). Row decoder 104 and column decoder 106 decode address signals A0–AX on address lines (or address bus) 108 to access memory cells 113. A data input path 114 and a data output path 116 transfer data between memory cells 113 and data lines (or data bus) 110. Data lines 110 carry data signals DQ0 through DQN. A memory controller 118 controls the modes of operations of memory device 100 based on control signals on control lines 120. Examples of control signals include a row access strobe signal RAS*, a column access strobe CAS* signal, a write enable signal WE*, and a clock signal CLK.

Memory device 100 further includes a word line driver circuit 150 and a driver control circuit 160 for activating memory cells 113 during an access mode based on address signals decoded by decoders 104 and 106 to transfer data between memory cells 113 and data lines 110. During a standby mode, word line driver circuit 150 and a driver control circuit 160 deactivate memory cells 113. Memory controller 118 initiates the access and standby modes.

Memory device 100 also includes a supply line 170 for receiving a supply voltage Vcc. A pump circuit 172 pumps Vcc to a pumped voltage Vp higher than Vcc. In some embodiments, memory device 100 uses Vp to activate memory cells 113 during the access mode. Memory device 100 further includes a negative voltage generator 174 for generating a negative voltage $V_N$ at node 176. In some embodiments, memory device 100 uses $V_N$ to deactivate memory cells 113 during the standby mode.

In some embodiments, memory device 100 is a dynamic random access memory (DRAM) device. In other embodiments, memory device 100 is a static random access memory (SRAM) device, or a flash memory. Some examples of DRAM devices include synchronous DRAM, commonly referred to as SDRAM (synchronous dynamic random access memory), SDRAM II, SGRAM (synchronous graphics random access memory), DDR SDRAM (double data rate SDRAM), DDR II SDRAM, and Synchlink or Rambus DRAM. Those skilled in the art recognize that memory device 100 includes other elements which are not shown for clarity.

Figure 2:
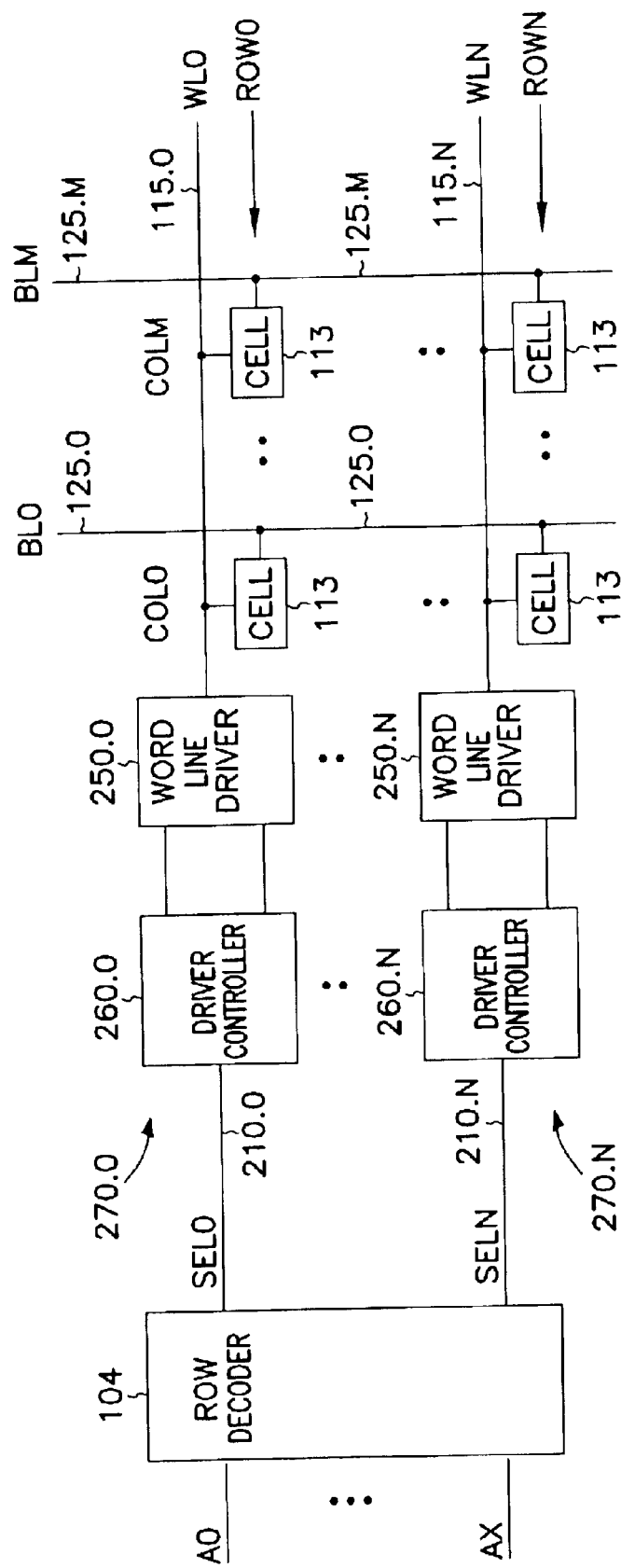
FIG. 2 shows more detail of a portion of the memory device of FIG. 1.

FIG. 2 shows more detail of a portion of the memory device of FIG. 1. Memory cells 113 are arranged in rows (Row0–RowN) and columns (Col0–ColM). Memory cells connect to a plurality of word lines 115.0–115.N and a plurality of bit lines 125.0–125.M. Word lines 115.0–115.N have word line signals WL0–WLN connects to memory cells 113. Bit lines 125.0–125.N have bit line signals BL0–BLM. The memory cells in the same row connect to one corresponding word line. The memory cells in the same column connect to one corresponding bit line. The voltage level on a word line activates the memory cells in the corresponding rows so that data can be read from or written to the memory cells via the corresponding bit line. The voltage signal of the bit line represents the data.

Word line driver circuit 150 (FIG. 1) includes multiple word line drivers 250.0–250.N, each connecting to a corresponding word line. Driver control circuit 160 (FIG. 1) includes a plurality of driver controllers 260.0–260.N, each connecting to a corresponding word line driver. A plurality of select lines 210.0–210.N connects between row decoder 104 and driver controllers 260.0–260.N. Select lines 210.0–210.N have select signals SEL0–SELN. Driver controllers 260.0–260.N, word line drivers 250.0–250.N, word lines 115.0–115.N form a plurality of word line driving paths 270.0–270.N between row decoder 104 and memory cells 113.

When a select line is selected, its corresponding select signal is activated. Each of the select lines 210.0–210.N corresponds to one of the word lines 115.0–115.N. When a select line is selected, the corresponding word line is also selected and its corresponding word line signal is activated. Each of the word line signals WL0–WLN has a signal level corresponding to an access voltage when the word line is activated. Each of the word line signals WL0–WLN also has a signal level corresponding to a standby voltage when the word line is deactivated (not activated). In embodiments represented by FIG. 2, each of the word line signals WL0–WLN has a signal level corresponding to a positive voltage when the word line is activated and a signal level corresponding to a negative voltage when the word line is deactivated.

During a memory access operation, decoder 104 decodes address signals A0–AX to select one of the select lines 210.0–210.N as a selected select line. The driver controller corresponding to the selected select line applies appropriate drive control signals to a corresponding selected word line driver. Based on the drive control signals, the selected word line driver drives the corresponding word line to various voltages to activate (open) the corresponding memory cells. After the corresponding memory cells are activated, one or more of these memory cells are accessed to either read data from or write data to the activated memory cells.

Figure 3:
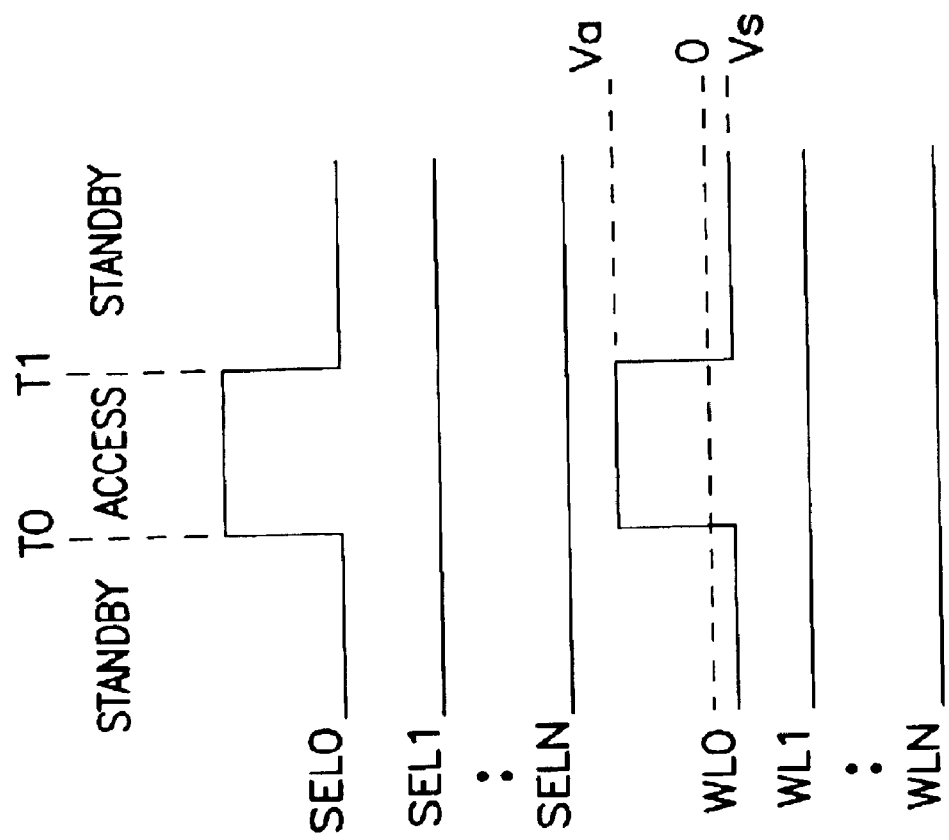
FIG. 3 is an exemplary timing diagram for FIG. 2.

FIG. 3 is an exemplary timing diagram for FIG. 2. A standby mode occurs before time T0 and after time T1. An access mode occurs between times T0 and T1. In some embodiments, the standby mode occurs when address decoder 104 selects none of the select lines 210.0–210.N (FIG. 2). And the access mode occurs when address decoder 104 selects at least one of the select lines 210.0–210.N. Thus, in these embodiments, none of the SEL0–SELN signals is activated in the standby mode and at least one of the SEL0–SELN signals is activated the access mode.

Each of the SEL0–SELN signals has one signal level in the standby mode and another signal level in the access mode. In some embodiments, in the standby mode, none of the signals SEL0–SELN is activated and they all have a low signal level. And in the access mode, at least one of the SEL0–SELN signals is activated to a high signal level. In FIG. 3, for example, when the SEL0 signal is activated between times T0 and T1 while all other select signals are not activated, the SEL0 signal has a high signal level, all other select signals remain at the low signal level.

The corresponding word line signal WL0 is also activated between time T0 and T1 when the SEL0 signal is activated. In the above, word line driver 250.0 is the selected word line driver, which drives the WL0 signal to various voltages between the standby mode and the access mode. As shown in FIG. 3, between the standby and the access mode, word line driver 250.0 drives the WL0 signal between Va and Vs where Va is greater than zero and Vs is less than zero. In some embodiments, Va corresponds to Vp (FIG. 1) and Vs corresponds to $V_N$. Thus, in these embodiments, the WL0 signal has a signal level corresponding a positive voltage and a signal level corresponding to a negative voltage.

In embodiments represented by FIG. 3, none of WL0–WLN signals is activated in the standby mode and no data is read from or written to memory cells 113. And in the access mode, at least one of the WL0–WLN signals is activated and data is read from or written to at least one of the memory cells 113. Further in the standby mode memory cells 113 are idle. Thus, the standby mode is also an idle mode.

In some embodiments, at least one of the WL0–WLN signals is still activated in the standby mode but no data is read from or written to memory cells 113.

Figure 4:
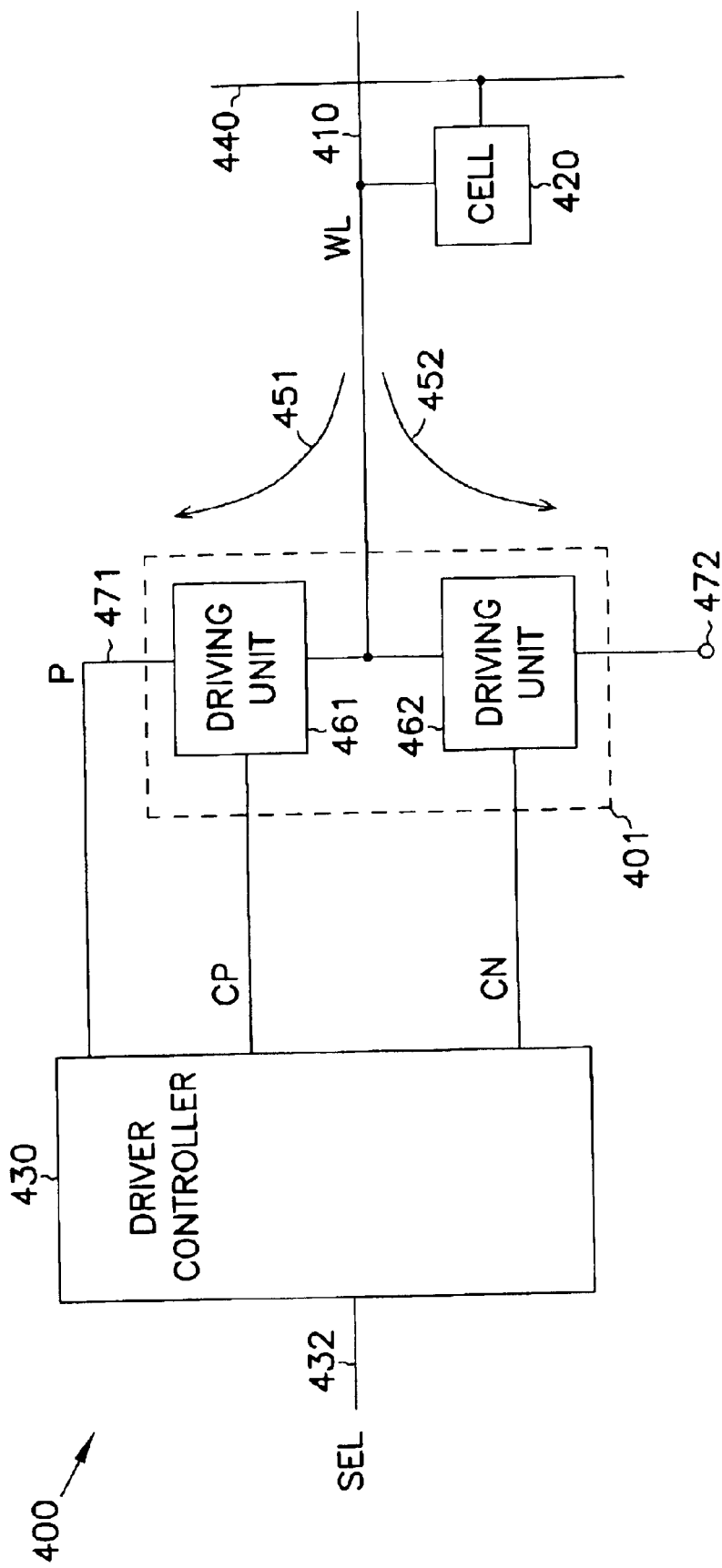
FIG. 4 shows a word line driving path according to an embodiment of the invention.

FIG. 4 shows a word line driving path according to an embodiment of the invention. Word line driving path 400 has a word line driver 401 which drives word line 410 to activate a memory cell 420, which connects to a bit line 440. A driver controller 430 controls word line driver 401 based on a select signal SEL on select line 432. Bit line 440 corresponds to one of the bit lines 125.0–125.M (FIG. 2). Word line driving path 400 corresponds to one of the word line driving paths 270.0–270.N (FIG. 2).

Word line driver 401 has a first current path 451 and a second current path 452. Via current paths 451 and 452, word line driver 410 drives word line 410 to various voltages between the access mode and the standby mode. In some embodiments, the access mode occurs when data is transferred between memory cell 420 and bit line 440. The standby mode occurs when no data is transferred between memory cell 420 and bit line 440; memory cell 420 is idle in the standby mode.

In the access mode, word line driver 401 drives word line 410 to an access voltage. In the standby mode, word line driver 401 drives word line 410 to standby voltage. The access voltage and the standby voltage are unequal. In embodiments represented by FIG. 4, word line driver 401 drives word line 410 to an access voltage equal to positive voltage and to a standby voltage equal to a negative voltage. The signal level of the WL signal indicates the voltage level of word line 410.

From the standby mode to the access mode, word line driver 401 drives word line 410 having the negative voltage to the positive voltage in one stage via current path 451.

From the access mode to the standby mode, word line driver 401 drives word line 410 having the positive voltage to the negative voltage in two separate stages via both current paths 451 and 452. In a first stage, word line driver 401 drives word line 410 having the positive voltage to ground via first current path 451. In a second operating stage, word line driver 401 further drives word line 410 from ground to the negative voltage via second current path 452.

Thus, current path 451 of word line driver 401 has two functions. A first function drives word line 410 from the negative voltage to the positive voltage during the access mode. A second function drives word line 410 from the positive voltage to ground during the standby mode. Current path 452 has a function of driving word line from ground to the negative voltage.

Current path 451 has a driving unit 461 connected between node 471 and word line 410. Node 471 receives a charge signal P. Current path 452 has a driving unit 462 connected between node 472 and word line 410. Node 472 receives a charge signal N. Driving unit 461 receives a drive control signal CP. Driving unit 462 receives a drive control signal CN.

Figure 5:
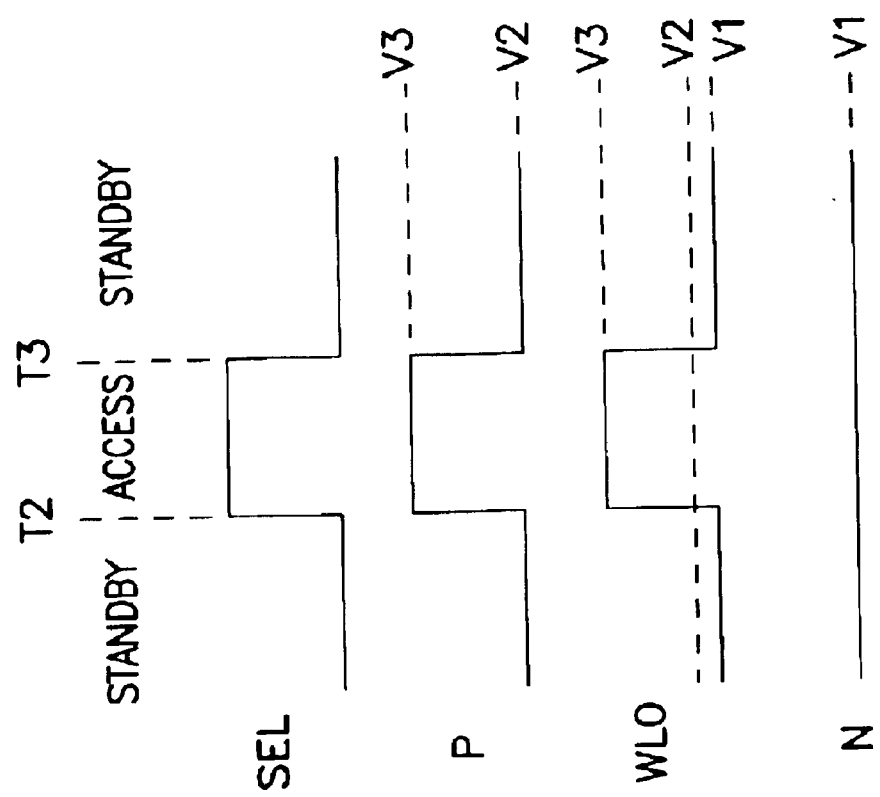
FIG. 5 is a timing diagram for FIG. 4.

FIG. 5 is a timing diagram for FIG. 4. The SEL signal is activated to a high signal level during the access mode between times T2 and T3. The P signal at node 471 varies between voltages V2 and V3. Thus, node 471 has a variable voltage (not fixed). The WL signal on word line 410 varies between voltages V1 and V3. The N signal is fixed at voltage V1. V1 is a negative voltage, V2 corresponds to ground (zero volt), and V3 is a positive voltage. In some embodiments, V1 corresponds to $V_N$ and V3 corresponds to Vp of FIG. 1.

As shown in FIG. 5, in the stand by mode, the WL signal has signal level corresponding to a negative voltage V1 while the P signal has signal level corresponding to ground (V2). In the access mode, the WL signal has signal level corresponding to a positive voltage V3, which is the same as the signal level of the P signal.

Referring to FIGS. 4 and 5, when path 400 switches from the standby node (before time T2) to the access mode (at time T2), driving unit 462 isolates node 472 from word line 410 in response to the CN signal. Driver controller 430 activates the P signal to a signal level corresponding V3. Thus, the voltage at node 471 is V3. Between time T2 and T3, driving unit 461 charges word line 410 to V3 via current path 451 in response to the CP signal.

When path 400 switches from the access mode (at time T3) to the standby mode, driver controller 430 deactivates the P signal to a signal level corresponding to V2 (ground). Thus, node 471 is ground. Driving unit 461 discharges word line 410 from V3 to ground in response to the CP signal. After word line 410 is at ground, driving unit 462 connects word line to node 472 in response to the CN signal to further discharge word line 410 from ground to the negative voltage V1.

Figure 6:
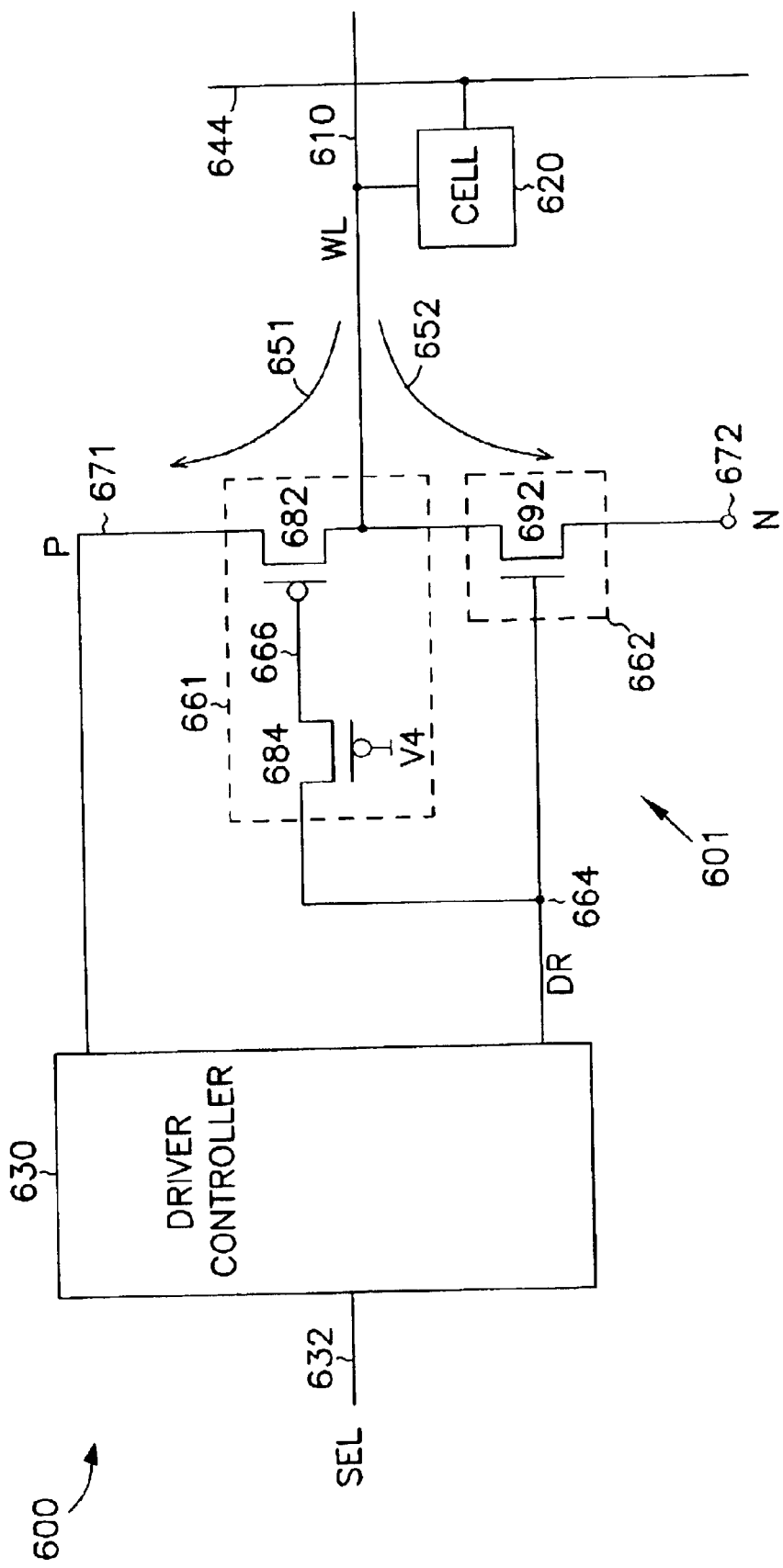
FIG. 6 shows another word line driving path according to another embodiment of the invention.

FIG. 6 shows another word line driving path according to another embodiment of the invention. Path 600 has a word line driver 601 which drives word line 610 to activate a memory cell 620 via current paths 651 and 652. Memory cell 620 connects to a bit line 644. Word line 610 has word line signal WL. A driver controller 630 controls word line driver 601 based on a select signal SEL signal on select line 632. Bit line 644 corresponds to one of the bit lines 125.0–125-M (FIG. 2). Word line driving path 600 corresponds to one of the word line driving paths 270.0–270.N (FIG. 2).

Current path 651 has a driving unit 661 connected between node 671 and word line 610. Node 671 receives a charge signal P. Current path 652 has a driving unit 662 connected between node 672 and word line 610. Node 672 receives a charge signal N. Driving units 651 and 652 receive a drive control signal DR on node 664. Node 671 has a variable voltage. Node 672 has a negative voltage.

Driving unit 661 includes a driving transistor 682 having a source connected to node 671, a drain connected to word line 610, and a gate connected to node 666. An isolation transistor 684 has a source connected to node 664, a drain connected to node 666, and a gate connected to a voltage V4. During the access mode, transistor 682 changes the voltage of word line 610 from a negative voltage to a positive voltage. During the standby mode transistor 682 changes the voltage of word line 610 from a positive voltage to ground.

Driving unit 662 includes a pulldown transistor 692 having a source connected to node 672, a drain connected to word line 610, and a gate connected to node 664. During the standby mode, transistor 692 changes the voltage of word line 610 from ground to a negative voltage.

Figure 7:
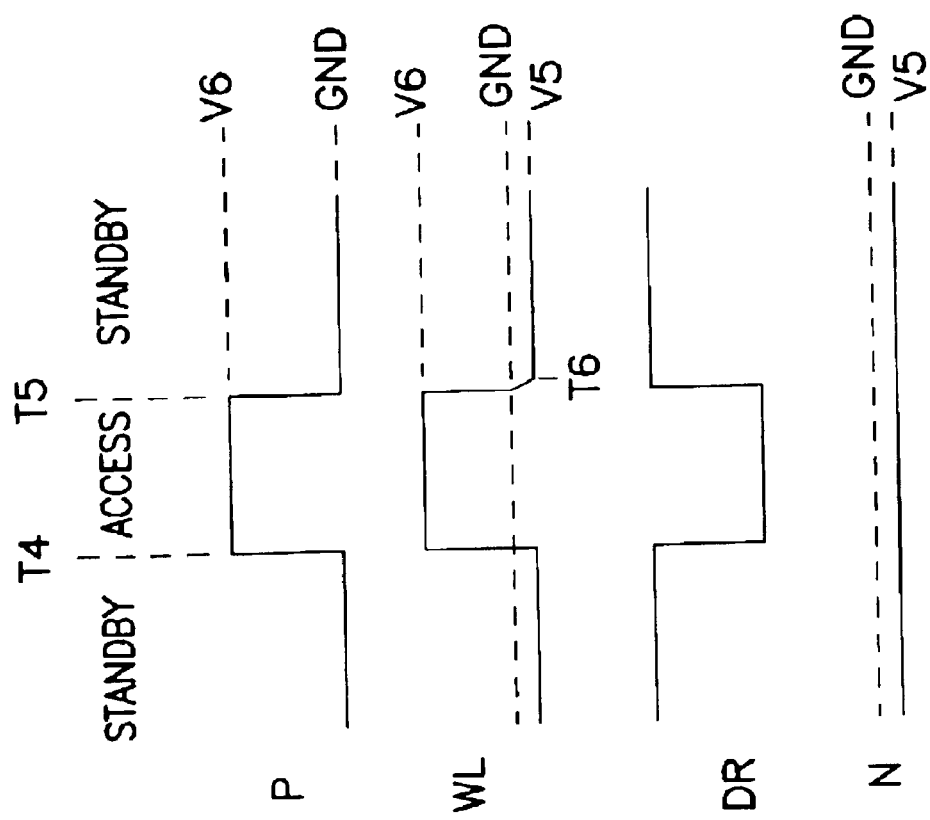
FIG. 7 is a timing diagram for FIG. 6.

FIG. 7 is a timing diagram for FIG. 6. The P signal at node 671 varies between ground (GND) and V6. The N signal is fixed at voltage V5. The WL signal on word line 410 varies between voltages V5 and V6. V5 is a negative voltage and V6 is a positive voltage. In some embodiments, V5 corresponds to $V_N$ and V6 corresponds to Vp of FIG. 1.

Referring to FIGS. 6 and 7, in the standby mode, the DR signal has a high signal level. This turns on transistor 692, connecting word line 610 to node 672. Since node 672 has a voltage V5, word line 610 also has a voltage of V5. In FIG. 6, V4 is equal to or less than zero. Thus, transistor 684 turns on, connecting node 666 to node 664. Since node 664 has a high signal level, node 666 also has a high signal level. This turns off transistor 682, disconnecting word line 610 from node 671. Thus, word line 610 remains at V5. In the standby mode node 671 is ground.

When the access mode is initiated at time T4, the DR signal switches to low, causing the voltage at node 664 low. Transistor 692 turns off, disconnecting word line 610 from node 672. Transistor 682 turns on connecting word line 610 to node 671. The P signal switches to V6, forcing the voltage of node 666 low and turning on transistor 682. This allows word line 610 to charge from V5 to V6 via current path 651.

When the standby mode is initiated at time T5, the P signal switches to ground. The voltage of node 666 goes even lower than ground. This allows word line 610 to quickly discharge from V6 to ground via current path 651. After word line 610 reaches ground, the DR signal switches to high, causing the voltage at node 664 high. Transistor 692 turns on, allowing word line 610 to further discharges from ground to V5 via current path 652.

Figure 8:
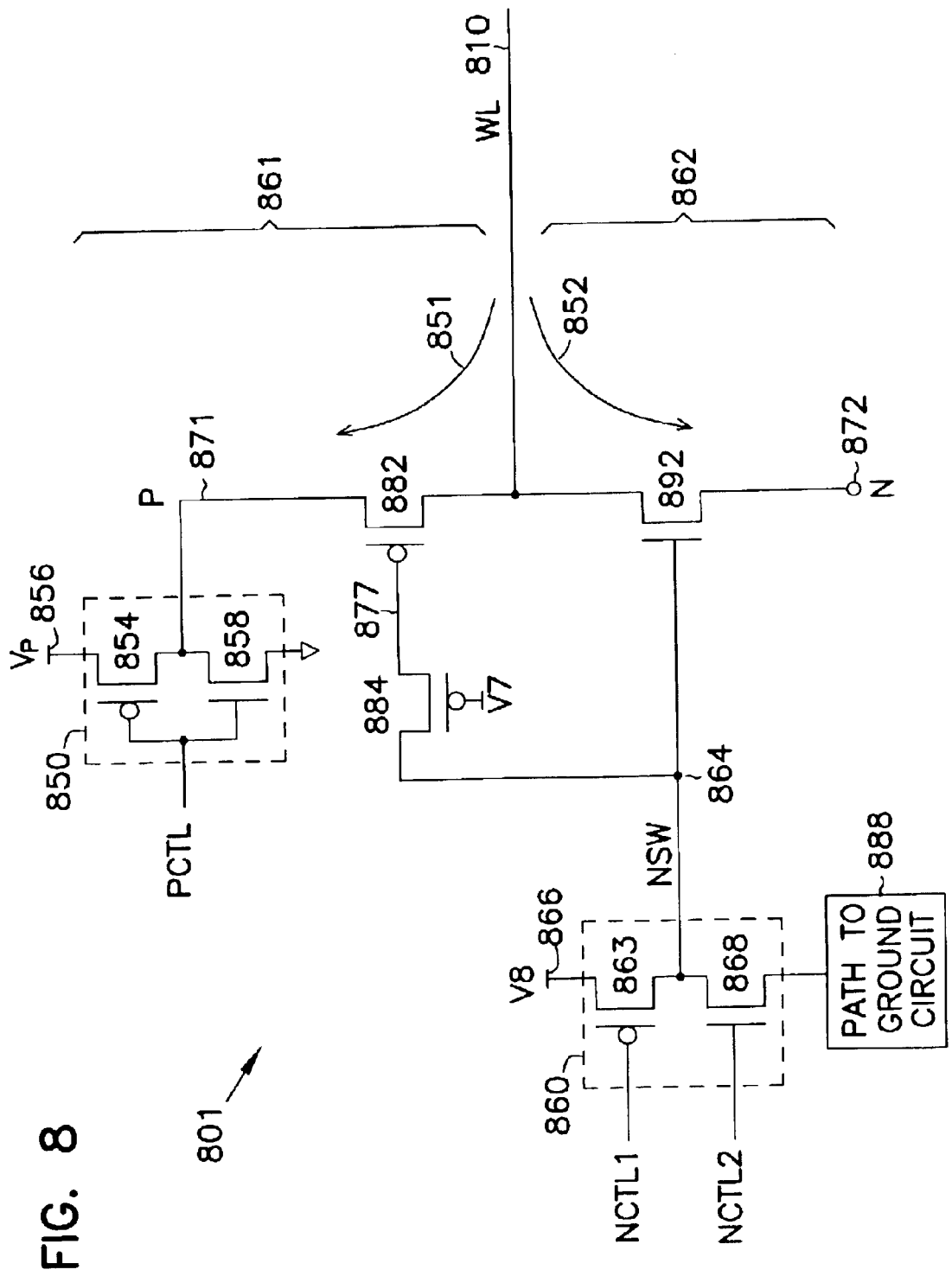
FIG. 8 shows a word line driver according to another embodiment of the invention.

FIG. 8 shows a word line driver according to another embodiment of the invention. Word line driver 801 drives word line 810 to a positive voltage when word line 801 is selected and to a negative voltage when word line 810 is deselected (not selected). Word line driver 801 can substitute one of the word line drivers 250.0–250.N of FIG. 2. A control circuit similar to memory controller 118 of FIG. 1 can select and deselect word line 810 in different operating modes.

Word line driver 801 includes transistors 882, 884, and 892 connected in a similar fashion as that of word line driver 601 (FIG. 6). Transistor 882 connects between word line 810 and node 871. Transistor 892 connects between word line 810 and node 872. Transistor 884 connects between the gates of transistors 882 and 892. Node 871 has a charge signal P. Node 872 has a charge signal N. The P signal has signal levels representing a variable voltage. The N signal has a signal level fixed at a voltage.

Word line driver 801 further includes switches 850 and 860. Drive control signal PCTL controls switch 850. In some embodiments, the PCTL signal switches between ground and Vp. Drive control signals NCTL1 and NCTL2 control switch 860. The PCTL, NCTL1, and NCTL2 are generated by a driver controller similar to one of the driver controllers 260.0–260.N (FIG. 2) and driver controller 630 (FIG. 6). In some embodiments, switches 850 and 860 are part of the driver controller.

Switch 850 includes a transistor 854 connected between node 871 and a supply node 856 and a transistor 858 connected between node 871 and ground. Node 856 has a voltage Vp. Switch 850 controls the signal P based on the signal levels of the PCTL. The P signal varies between ground and Vp. Switch 850, and transistors 882 and 884 form a driving unit 861 similar to driving unit 461 (FIG. 4).

Switch 860 includes a transistor 863 connected between node 864 and a supply node 866 and a transistor 868 connected between node 864 and a path to ground circuit 888. When transistor 868 turns on, path to ground circuit 888 provides a ground potential to node 864. In some embodiments, path to ground circuit 888 connects node 864 directly to ground when transistor 868 turns on. Node 866 has a voltage V8. In some embodiments, V8 equals Vp. Switch 860 controls a signal NSW at node 864 based on the signal levels of the NCTL1 and NCTL2 signals. The NSW signal varies between ground (or a negative voltage) and V8. Switch 860 and transistor 892 form a driving unit 862 similar to driving unit 462 (FIG. 4).

Word line 810 has a negative and a positive voltage. When word line 810 is selected, driving unit 861 drives word line 810 from a negative voltage to a positive voltage via current path 851. When word line 810 is not selected, driving unit 861 drives word line 810 from the positive voltage to the negative voltage in two stages. In one stage, driving unit 861 drives word line 810 from the positive voltage to ground via current path 851. In another stage, after word line 810 reaches ground, driving unit 862 further drives word line 810 from ground to the negative via current path 852.

Figure 9:
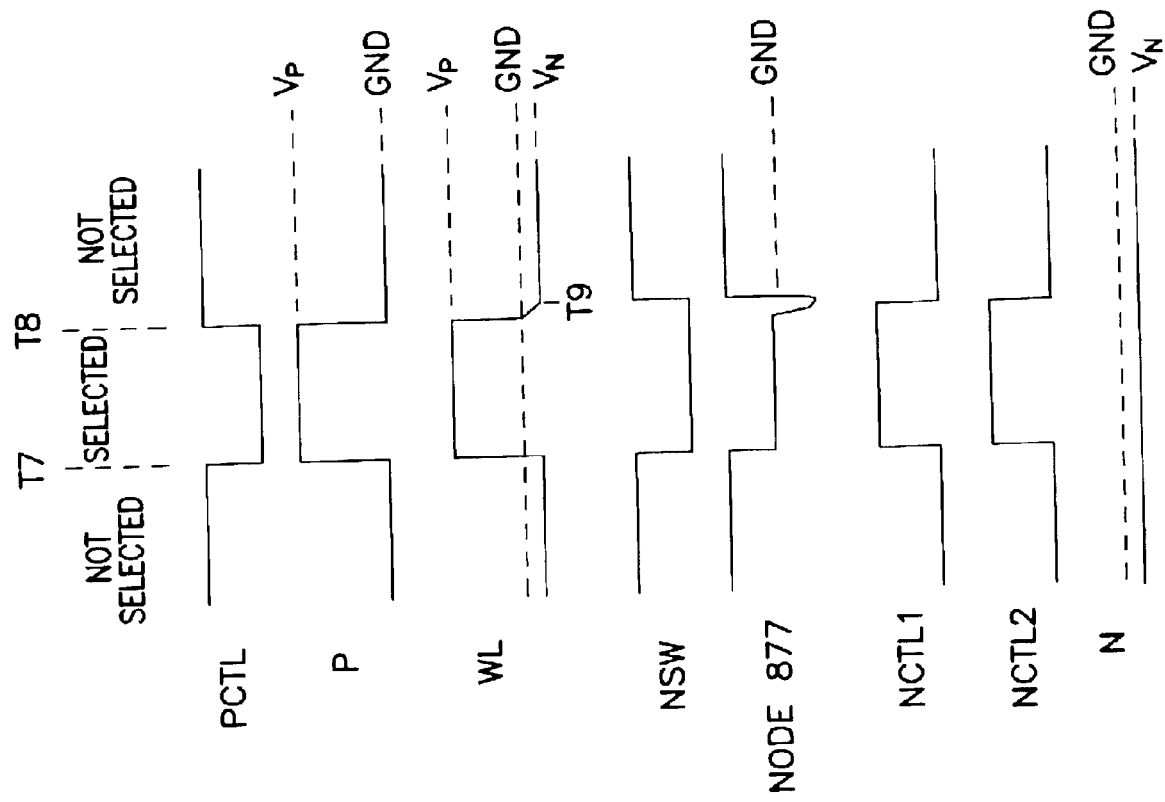
FIG. 9 is a timing diagram for FIG. 8.

FIG. 9 is a timing diagram for FIG. 8. The P signal varies between ground (GND) and Vp. The N signal is fixed at $V_N$. The WL signal varies between voltages Vp and $V_N$.

Referring to FIGS. 8 and 9, when word line 810 is not selected, the NCTL1 and NCLT2 signals have a low signal level. Transistor 868 turns off. Transistor 863 turns on, connecting node 864 to V8 (high). When node 864 is high, transistor 892 turns on, connecting word line 810 to node 872. Since node 872 has a voltage $V_N$, the WL signal on word line 810 also has a voltage of $V_N$. In FIG. 8, V7 is equal to or less than zero. Thus, transistor 884 turns on, connecting node 877 to node 864. Since node 864 has a high signal level, node 877 also has a high signal level. When node 877 is high enough compared with node 871, transistor 882 turns off, disconnecting word line 810 from node 871. Thus, the WL signal remains at $V_N$. When word line 810 is not selected, the PCTL signal has a high signal level.

When word line 810 is selected at time T7, the NCTL1 and NCTL2 signals switch to high, transistor 863 turns off. Transistor 868 turns on, connecting node 864 to ground (low). When node 864 is low, transistor 892 turns off, disconnecting word line 810 from node 872. Transistor 882 turns on connecting word line 810 to node 871. The PCTL signal switches to low, transistor 858 turns off, transistor 854 turns on connecting node 871 to node 856, which has the voltage Vp. Thus, the P signal on node 871 switches to Vp and forces the voltage of node 877 low (or V7 plus the absolute value of Vtp, where Vtp is the threshold voltage of transistor 884). This allows transistor 882 to remain conductive, allowing word line 810 to charge from $V_N$ to Vp via current path 851.

When word line 810 is not selected at time T8, the PCTL signal switches to high (or Vp). Transistor 854 turns off. Transistor 858 turns on, connecting node 871 to ground. The voltage of node 877 goes even lower than ground. This allows word line 810 to quickly discharge from Vp to ground via current path 851. Node 877 is "boosted" to V7 minus the absolute value of Vtp by capacitor coupling. After word line 810 reaches ground, the NCTL1 and NCTL2 signals switch to low. Transistor 868 turns off. Transistor 863 turns on. This connects node 864 to V8 to turn off transistor 882 on current path 851. The high signal level on node 864 turns on transistor 892, allowing word line 810 to further discharge from ground to $V_N$ via current path 852.

Figure 10:
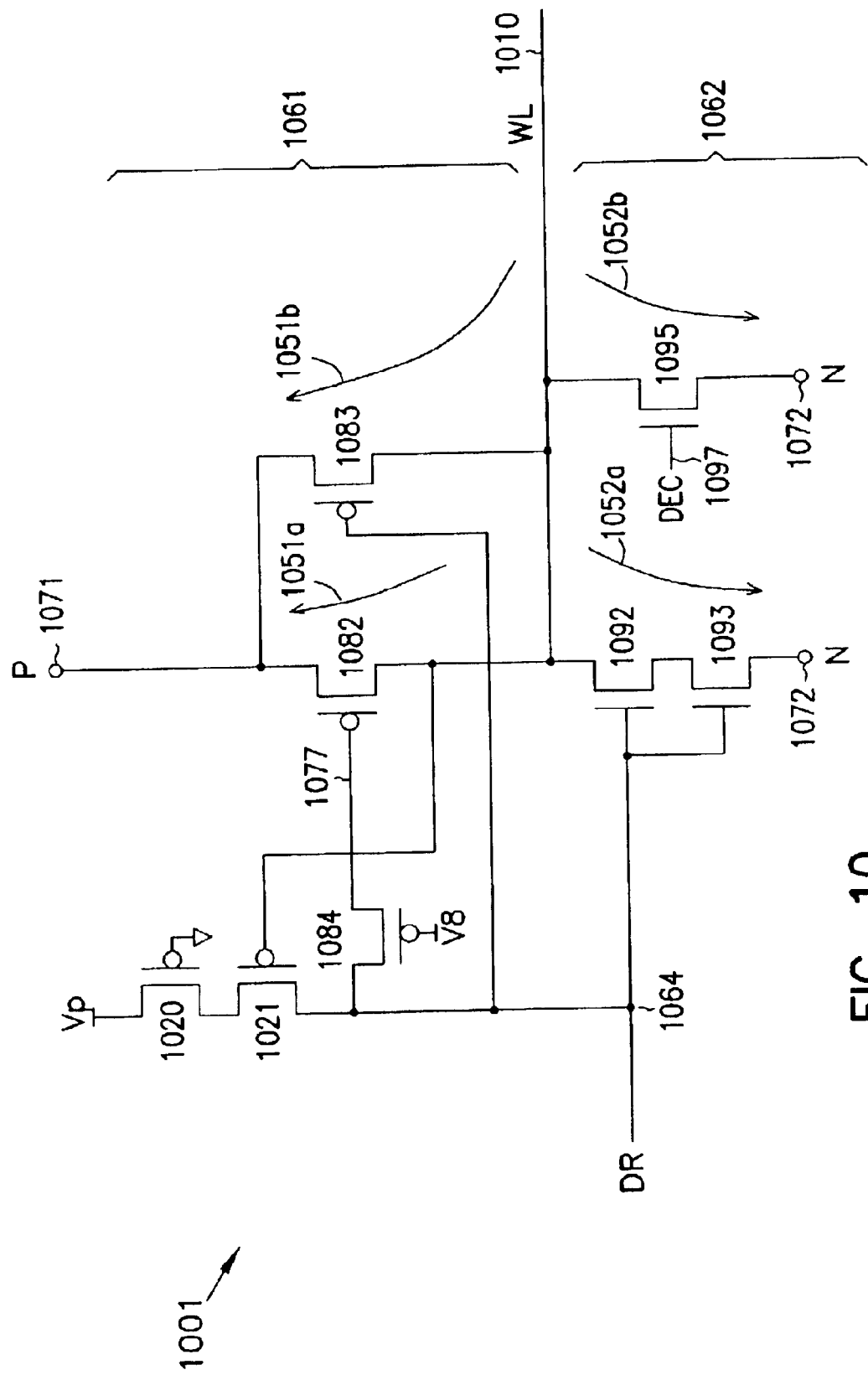
FIG. 10 shows another word line driver according to an alternative embodiment of the invention.

FIG. 10 shows another word line driver according to an alternative embodiment of the invention. Word line driver 1001 drives word line 1010 to a positive voltage when it is selected in the access mode and to a negative voltage when it is deselected in the standby mode. Word line driver 1001 can substitute one of the word line drivers 250.0–250.N of FIG. 2. A control circuit similar to memory controller 118 of FIG. 1 initiates the access and standby modes.

Word line driver 1001 includes current paths 1051 and 1052. A combination of branched current paths 1051a and 1051b forms current path 1051. Current path 1051a includes a current path between word line 1010 and node 1071 through a first driving transistor 1082. Current path 1051b includes a current path between word line 1010 and node 1071 through a second driving transistor 1083.

A combination of branched current paths 1052a and 1052b forms current path 1052. Current path 1052a includes a current path between word line 1010 and node 1072 through series connected pulldown transistors 1092 and 1093. Current path 1052b includes a current path between word line 1010 and node 1072 through a pulldown transistor 1095.

Transistors 1082 and 1083 and an isolation transistor 1084 form a driving unit 1061. Transistors 1020, 1021, 1092, 1093, and 1095 form another driving unit 1062. Driving unit 1061 drives word line 1010 from a negative voltage to a positive voltage during the access mode and drives word line 1010 from a positive voltage to ground during the standby mode. Driving unit 1062 drives word line 1010 from ground the standby mode to a negative voltage.

Node 1071 receive a charge signal P that switches between different signal levels representing different voltages. Node 1072 receives a charge signal N that remains at a fixed level representing a fixed voltage. Node 1064 receives drive control signal DR. Node 1097 receives another drive control signal DEC. The P, DR, and DEC signals are generated by a drive controller similar to one of the drive controllers 260.0–260.N (FIG. 2) and driver controller 630 (FIG. 6).

Figure 11:
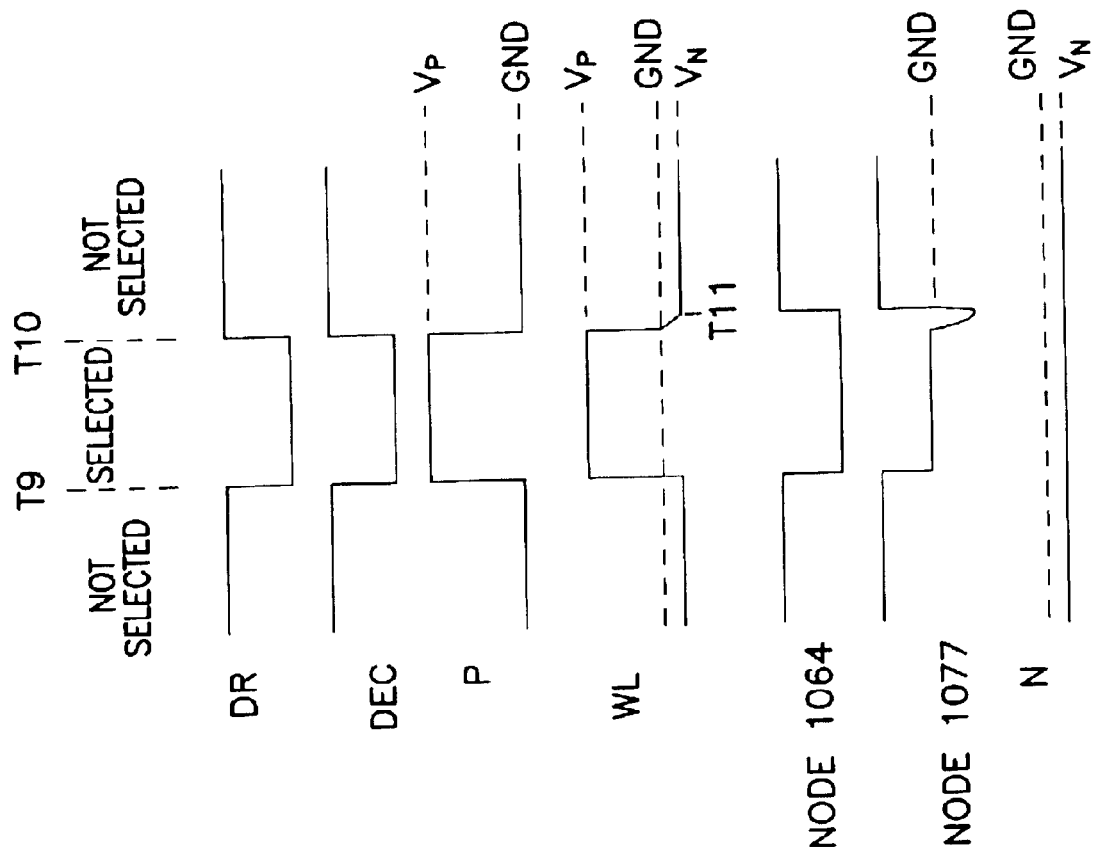
FIG. 11 is a timing diagram for FIG. 10.

FIG. 11 is a timing diagram for FIG. 10. The P signal at node 1071 varies between ground (GND) and Vp. The N signal is fixed at $V_N$. The WL signal varies between voltages Vp and $V_N$.

Referring to FIGS. 10 and 11, when word line 1010 is not selected, the DR and DEC signals are high. When these signals are high, transistors 1092, 1093, and 1095 turn on, connecting word line 1010 to node 1072. The Since node 1072 has a voltage $V_N$, word line 1010 also has a voltage of $V_N$. In FIG. 10, V8 is equal to or less than zero. Thus, transistor 1084 turns on, connecting node 1077 to node 1064. Since node 1064 has a high signal level, node 1077 also has a high signal level. When node 1077 is high enough, transistor 1082 turns off. Transistor 1083 also turns off because node 1064 has a high signal level. When transistors 1082 and 1083 turn off, word line 1010 is disconnected from node 1071. Thus, the signal level of the WL signal remains at $V_N$. When word line 1010 is not selected, the P signal is has a low signal level.

When word line 1010 is selected at time T9, the DR (node 1064) and DEC signals switch to low signal levels. When these signals are low, transistors 1092, 1093, and 1095 turn off, disconnecting word line 1010 from node 1072. When node 1064 is low, node 1077 is also low. When these nodes are low, both transistors 1082 and 1083 turn on. When transistors 1082 and 1083 turn on, word line 1010 connects to node 1071. The P signal on node 1071 switches to Vp. Thus, the WL signal switches to Vp via current path 1051 (1051a and 1051b).

When word line 1010 is not selected at time T10, the P signal switches to ground. Word line 1010 discharges from Vp to ground via current path 1051. After word line 1010 reaches ground, the DR signal switches to high to turn off both transistors 1082 and 1083 on current path 1051. The DEC signal also switches to high. When both of the DR and DEC signals are high, transistors 1092, 1093, and 1095 turn on, allowing word line 1010 to further discharge from ground to $V_N$ via current path 1052 (1052a and 1052b).

In alternative embodiments of the invention, transistor 1083 (FIG. 10), or transistor 1095, or both can be omitted without departing from the scope of the invention.

Figure 12:
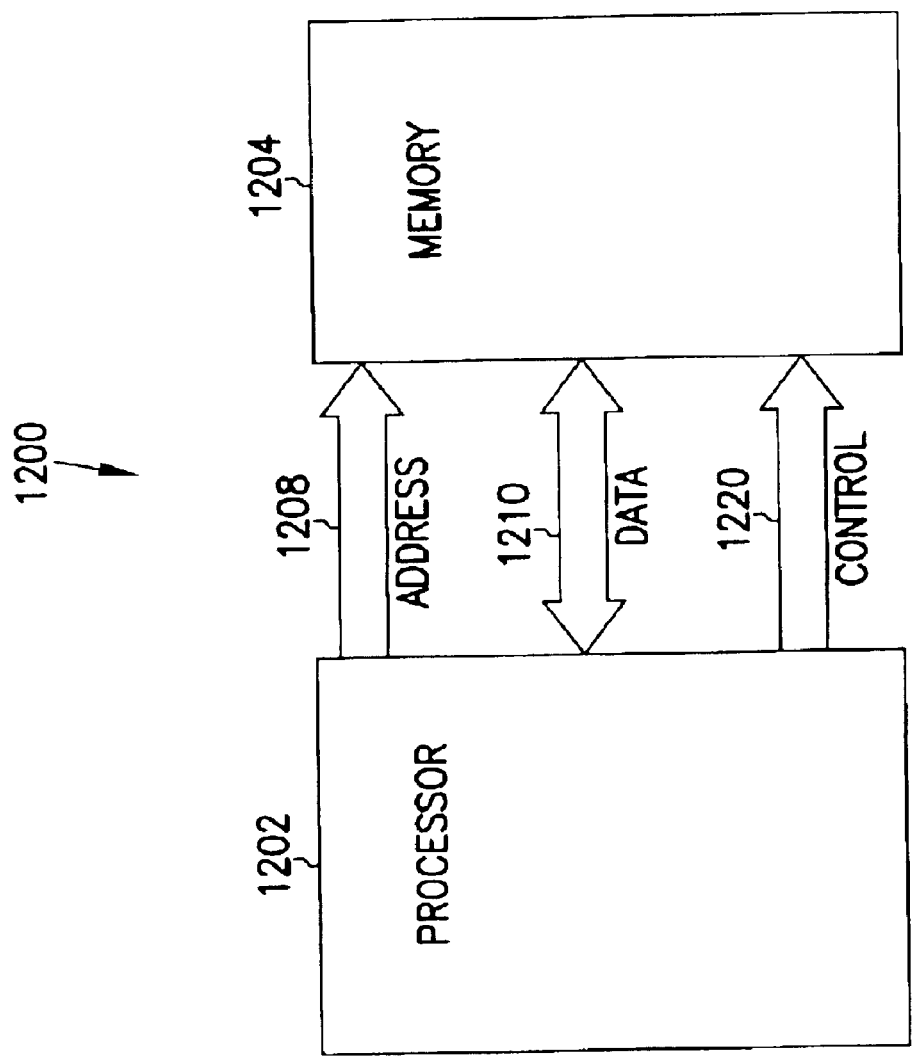
FIG. 12 shows a system according to an embodiment of the invention.

FIG. 12 shows a system according to an embodiment of the invention. System 1200 includes a first integrated circuit (IC) 1202 and a second IC 1204. ICs 1202 and 1204 can include processors, controllers, memory devices, application specific integrated circuits, and other types of integrated circuits. In embodiments represented by FIG. 12, for example, IC 1202 represents a processor, and IC 1204 represents a memory device. Processor 1202 and memory device 1204 communicate using address signals on lines 1208, data signals on lines 1210, and control signals on lines 1220.

Memory device 1204 corresponds to memory device 100 of FIG. 1. Thus, memory device 1204 has elements similar to the elements of memory device 100. Further, memory device 1204 also includes word line drivers similar to word line drivers described in the specification.

System 1200 represented by FIG. 12 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention describe circuits and methods for driving word lines of memory devices to a negative voltage without generating excessive noise or with reducing high negative current. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A memory device comprising:
   a memory cell;
   a word line connected to the memory cell; and
   a word line driver including:
      a first current path connected to the word line for driving the word line to a first voltage during an access mode and for driving the word line to a second voltage unequal to the first voltage during a standby mode; and
      a second current path connected to the word line for further driving the word line from the second voltage to a third voltage, where the third voltage is unequal to the second voltage or the first voltage.

2. A memory device comprising:
   a memory cell;
   a word line connected to the memory cell;
   a word line driver including:
      a first current oath connected to the word line for driving the word line to a first voltage during an access mode and for driving the word line to a second voltage unequal to the first voltage during a standby mode; and
      a second current path connected to the word line for further driving the word line from the second voltage to a third voltage unequal to the second voltage
   wherein the first current path includes:
      a first node for receiving a first charge signal with a first signal level corresponding to the first voltage and a second signal level corresponding to the second voltage; and
      a first driving unit connected to the first node and the word line for changing a voltage of the word line to a voltage corresponding to one of the first and second signal levels of the based on the first charge signal.

3. The memory device of claim 2, wherein the second current path includes:
   a second node for receiving a second charge signal with a signal level corresponding to the third voltage; and
   a second driving unit connected to the second node and the word line for changing a voltage of the word line to the third voltage during the standby mode.

4. A memory device comprising:
   a memory cell;
   a word line connected to the memory cell; and
   a word line driver connected to the memory cell, the word line driver including:
      a first node having a first voltage during an access mode and having a second voltage unequal to the first voltage during standby mode;
      a first driving unit connected to the first node and the word line for charging the word line to the first voltage during the access mode and for discharging the word line to the second voltage during the standby mode;
      a second node having a negative voltage; and a second driving unit connected to the second node and the word line for discharging the word line from the second voltage to the negative voltage during the standby mode.

5. The memory device of claim 4, wherein the first driving unit includes a driving transistor connected between the word line and the first node.

6. The memory device of claim 5, wherein the second driving unit includes a pulldown transistor connected between the word line and the second node.

7. The memory device of claim 6, wherein the first driving unit further includes an isolation transistor connected between a gate of the driving transistor and a gate of the pulldown transistor.

8. A memory device comprising:
a memory cell;
a word line connected to the memory;
a first driving unit connected to the word line for changing a voltage of the word line to a positive voltage during an access mode and to ground during a standby mode; and
a second driving unit connected to the word line for changing a voltage of the word line from ground to a negative voltage during the standby mode.

9. The memory device of claim 8, wherein the first driving unit includes a driving transistor connected between the word line and a first node having a variable voltage.

10. The memory device of claim 9, wherein the second driving unit includes a pulldown transistor connected in series between the word line and a second node having the negative voltage.

11. The memory device of claim 10, wherein the first driving unit further includes an isolation transistor connected between a gate of the first driving transistor and a gate of the first pulldown transistor.

12. A memory device comprising:
a plurality of bit lines and a plurality of word lines;
a plurality of memory cells, each connecting to one of the bit lines and one of the word lines;
an address decoder connected to the word lines drivers for selecting one of the word lines as a selected word line based on a plurality of address signals to access memory cells connected to the selected word line; and
a plurality of word line drivers connected to the address decoder, each of the word line drivers connecting to a corresponding word line for driving the corresponding word line to various voltages, each of the word line driver including:
 a first current path connected to the word Line for driving the corresponding word line to a first voltage during when the corresponding word line is the selected word line, and for driving the word line to a second voltage after memory cells connected to the selected word line are accessed; and
 a second current path connected to the word line for farther driving the selected word line from the second voltage to a third voltage.

13. The memory device of claim 12, wherein the first current path includes:
a first node for receiving a first charge signal with a first signal level corresponding to the first voltage and a second signal level corresponding to the second voltage;
a first driving unit connected to the first node and the word line for changing a voltage of the word line to a voltage corresponding to one of the first and second signal levels of the based on the first charge signal.

14. The memory device of claim 13, wherein the second current path includes:
a second node for receiving a second charge signal with a signal level corresponding to the third voltage; and
a second driving unit connected to the second node and the word line for changing a voltage of the word line to the third voltage during the standby mode.

15. A system comprising:
a processor; and
a memory device connected to the processor, the memory device including:
 a memory cell;
 a word line connected to the memory cell; and
 a word line driver including:
  a first current path connected to the word line for driving the word line to a first voltage during an access mode and for driving the word line to a second voltage unequal to the first voltage during a standby mode; and
  a second current path connected to the word line for further driving the word line from the second voltage to a third voltage unequal to the second voltage.

16. The system of claim 15, wherein the first current path includes:
a first node for receiving a first charge signal with a first signal level corresponding to the first voltage and a second signal level corresponding to the second voltage;
a first driving unit connected to the first node and the word line for changing a voltage of the word line to a voltage corresponding to one of the first and second signal levels of the based on the first charge signal.

17. The system of claim 16, wherein the second current path includes:
a second node for receiving a second charge signal with a signal level corresponding to the third voltage; and
a second driving unit connected to the second node and word line for changing a voltage of the word line to the third voltage during the standby mode.

18. A method comprising:
receiving a select signal;
driving a word line to a first voltage via a first current path during a first signal level of the select signal;
driving the word line from the first voltage to a second voltage via the first current path during a second signal level of the select signal; and
driving the word line from the second voltage to a third voltage via a second current path during the second signal level of the select signal.

19. The method claim 18, wherein the first voltage is higher than the second voltage.

20. The method claim 19, wherein the second voltage is higher than the third voltage.

21. The method claim 18, wherein the first voltage is a positive voltage.

22. The method claim 21, wherein the second voltage is ground.

23. The method claim 22, wherein the third voltage is a negative voltage.

24. A method comprising:
initiating an access mode to access a memory cell of a memory device;

charging a word line to a first voltage via a first current path during the access mode;

initiating a standby mode;

discharging the word line from the first voltage to a second voltage during the standby mode; and discharging the word line from the second voltage to a third voltage via a second current path during the standby mode.

25. The method claim 24, wherein the first voltage is higher than a supply voltage of the memory device.

26. The method claim 25, wherein the second voltage is ground.

27. The method claim 26, wherein the third voltage is a negative voltage.

* * * * *

UNITED STATES PATENT AND TRADEMARK OFFICE
CERTIFICATE OF CORRECTION

PATENT NO. : 6,754,131 B2
DATED : June 22, 2004
INVENTOR(S) : Kirsch et al.

It is certified that error appears in the above-identified patent and that said Letters Patent is hereby corrected as shown below:

Column 1,
Line 6, after "present" delete ",".

Column 10,
Line 28, delete "oath" and insert -- path --, therefor.

Column 11,
Line 50, delete "Line" insert -- line --, therefor.
Line 58, delete "farther" and insert -- further --, therefor.

Column 12,
Lines 55, 57, 59, 61 and 63, after "method" insert -- of --.

Column 14,
Lines 1, 3 and 5, after "method" insert -- of --.

Signed and Sealed this

Thirtieth Day of November, 2004

JON W. DUDAS
*Director of the United States Patent and Trademark Office*